(12) United States Patent
Jung

(10) Patent No.: US 8,213,238 B2
(45) Date of Patent: Jul. 3, 2012

(54) NON-VOLATILE MEMORY DEVICE HAVING SEPARATE TRANSISTORS FOR PROGRAM AND ERASE OPERATIONS AND READING OPERATION AND DRIVING METHOD THEREOF

(75) Inventor: Jin-Hyo Jung, Suwon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 304 days.

(21) Appl. No.: 12/643,673

(22) Filed: Dec. 21, 2009

(65) Prior Publication Data

US 2010/0165745 A1 Jul. 1, 2010

(30) Foreign Application Priority Data

Dec. 30, 2008 (KR) .................. 10-2008-0137566

(51) Int. Cl.
*G11C 16/04* (2006.01)

(52) U.S. Cl. ......... 365/185.26; 365/185.33; 365/185.28; 365/185.29

(58) Field of Classification Search ............. 365/185.26, 365/185.33, 185.28, 185.29
See application file for complete search history.

(56) References Cited

U.S. PATENT DOCUMENTS

| | | | |
|---|---|---|---|
| 6,274,898 B1 * | 8/2001 | Mehta et al. | 257/298 |
| 6,995,436 B2 * | 2/2006 | Kawasaki | 257/390 |
| 7,217,966 B1 * | 5/2007 | Vashchenko et al. | 257/210 |

* cited by examiner

*Primary Examiner* — Connie Yoha
(74) *Attorney, Agent, or Firm* — Sherr & Vaughn, PLLC

(57) ABSTRACT

A non-volatile memory device and a driving method thereof. The non-volatile memory device includes a floating gate formed on and/or over a first type well, and transistors formed on and/or over a second type well and connected in series to the floating gate. One of the transistors is a first transistor for program and erase operations, and the other one is a second transistor for a reading operation.

20 Claims, 8 Drawing Sheets

FIG. 7

| Operation | WL | BL | Vs | Dl | Vb |
|---|---|---|---|---|---|
| PGM (CHEI) | +Vcgp | +Vdp | 0V (GND) | 0V (GND) | 0V (GND) |
| ERS1 (FNT) | 0V(GND) | +Vde | 0V (GND) | Floating | 0V (GND) |
| ERS2 (FNT) | 0V(GND) | +Vde | 0V (GND) | 0V (GND) | 0V (GND) |
| ERS3 (FNT) | 0V(GND) | +Vde | 0V (GND) | +Vde | 0V (GND) |
| ERS4 (FNT) | 0V(GND) | +Vde | Floating | Floating | 0V (GND) |
| ERS5 (FNT) | 0V(GND) | +Vde | Floating | 0V (GND) | 0V (GND) |
| ERS6 (FNT) | 0V(GND) | +Vde | Floating | +Vde | 0V (GND) |
| ERS7 (FNT) | 0V(GND) | +Vde | +Vde | +Vde | 0V (GND) |
| READ1 | +Vcgr | Floating | 0V (GND) | +Vdr | 0V (GND) |
| READ2 | +Vcgr | 0V (GND) | 0V (GND) | +Vdr | 0V (GND) |
| READ3 | +Vcgr | Floating | +Vdr | 0V (GND) | 0V (GND) |
| READ4 | +Vcgr | 0V (GND) | +Vdr | 0V (GND) | 0V (GND) |

NON-VOLATILE MEMORY DEVICE HAVING SEPARATE TRANSISTORS FOR PROGRAM AND ERASE OPERATIONS AND READING OPERATION AND DRIVING METHOD THEREOF

The present application claims priority under 35 U.S.C. §119 to Korean Patent Application No. 10-2008-0137566 (filed on Dec. 30, 2008), which is hereby incorporated by reference in its entirety.

BACKGROUND

Non-volatile memories may include a single poly Electrically Erasable Programmable Read Only Memory (EEPROM), a stack gate (Electron Tunnel Oxide (ETOX)), a dual poly EEPROM, and a split gate. The single poly EEPROM includes a single polycrystalline silicon layer functioning as a gate, and the stack gate includes two polycrystalline silicon layers vertically stacked one above another. The dual poly EEPROM and the split gate correspond to an intermediate between the single poly EEPROM and the stack gate. The stack gate has the smallest cell size and relatively complicated circuits. Such a stack gate may be suitable for high density and high performance, but may not be suitable for low density. EEPROMs are mainly used for low density. For example, the single poly EEPROM may be manufactured by adding approximately two mask processes during a logic process. However, the single poly EEPROM has a cell size approximately 200 times that of the stack gate, and thus, is not suitable for high density. The dual poly EEPROM and the split gate, which correspond to an intermediate between the single poly EEPROM and the stack gate, have a disadvantage of complicated manufacturing processes.

Figure 1A:
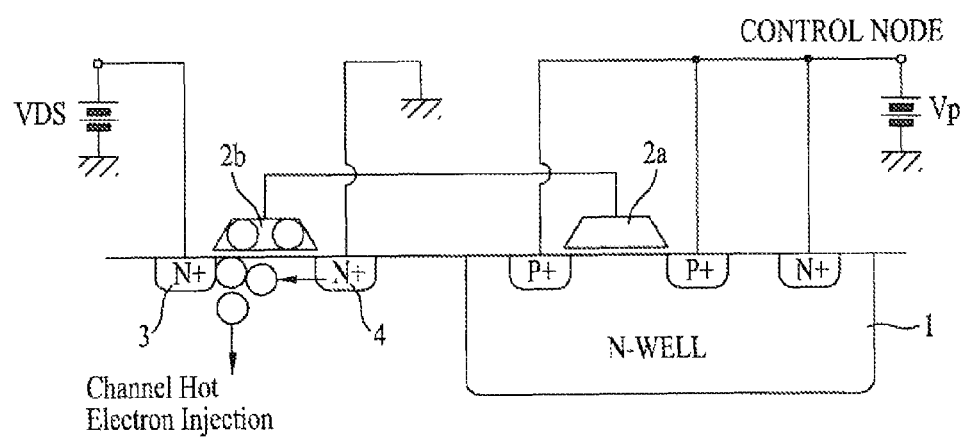

FIG. 1A illustrates a program method of a single poly EEPROM using channel hot electron injection.

As illustrated in FIG. 1A, if program voltage +Vp is applied to N-well 1A, a predetermined voltage is induced in floating gate 2a. The predetermined voltage induced in floating gate 2a causes inversion of a channel region of an N-channel Metal Oxide Semiconductor (NMOS) device. Here, the voltage induced in floating gate 2a is determined by a coupling ratio. Then, if predetermined voltage VDS is applied to drain region 3 of the NMOS device, current flows from drain region 3 to source region 4. In this case, as channel hot electrons generated near a drain junction are injected into floating gate 2b, a threshold voltage of the NMOS device is increased.

Figure 1B:
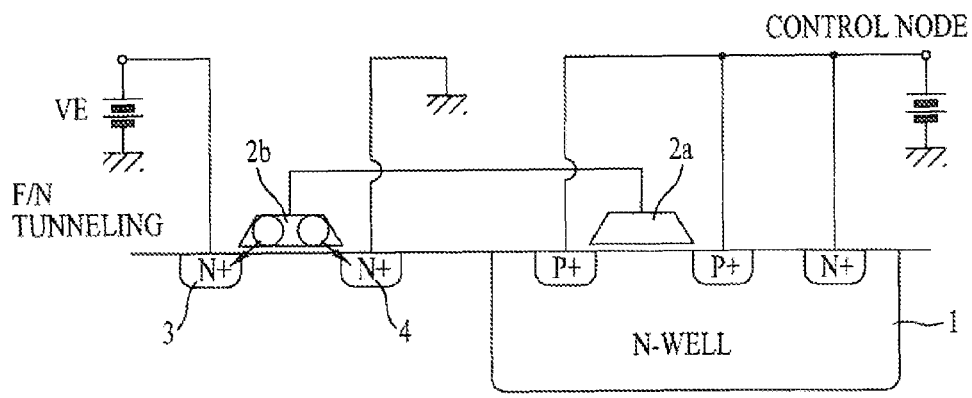

FIG. 1B illustrates an erase method of a single poly EEPROM using Fowler Nordheim (F/N) tunneling.

As illustrated in FIG. 1B, N-well 1 is grounded, and erase voltage +VE is applied to drain region 3 and source region 4 of the NMOS device. With grounded N-well 1, a potential close to a ground level is included in floating gate 2a. Also, with erase voltage +VE applied to drain region 3 and source region 4 of the NMOS device, an electric field is strengthened from drain region 3 and source region 4 of the NMOS device toward floating gate 2b. As electrons in floating gate 2b are moved into drain region 3 and source region 4 under the influence of the electric field, the threshold voltage of the NMOS device is reduced.

Figure 1C:
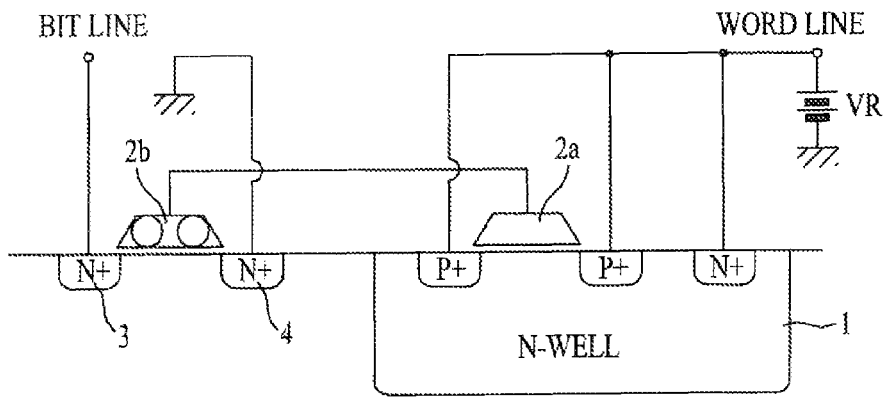

FIG. 1C illustrates a reading method of a single poly EEPROM.

As illustrated in FIG. 1C, reading voltage +VR is applied to the N-well 1 and in turn, a predetermined voltage is induced in floating gate 2a by applied reading voltage +VR. A positive drain voltage for a reading operation is applied to drain region 4 of the NMOS device, and source region 4 is grounded. If the NMOS device has a considerably high threshold voltage indicative of a program state in which electrons are injected in floating gate 2b, the NMOS device cannot be turned on even by the predetermined voltage induced in floating gate 2a, and thus, no current flow occurs. On the other hand, if the NMOS device has a considerably low threshold voltage indicative of an erase state in which no electrons are present in floating gate 2b, the NMOS device can be turned on by the predetermined voltage induced in floating gate 2a, and thus, current flow occurs.

Considering endurance characteristics of the above-described single poly EEPROM, electron traps are created in the channel region and the drain/source regions of the NMOS device during program/erase operations. The greater the number of the program/erase operations, i.e., the greater the number of cycles, the greater the number of the electron traps, resulting in a considerable increase in program/erase threshold voltages, more particularly, in an erase threshold voltage.

Figure 1D:
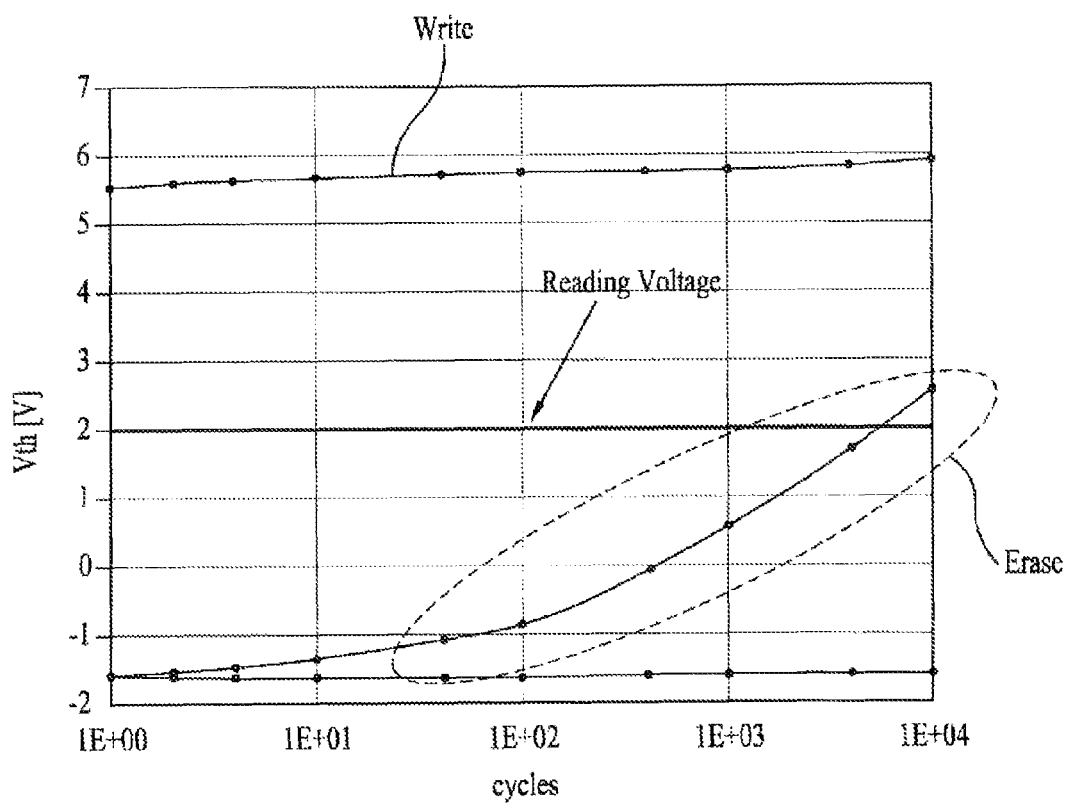

FIG. 1D is a view illustrating endurance characteristics of the related art.

As illustrated in FIG. 1D, the erase threshold voltage has substantially no variation below 10 cycles, but gradually increases above 10 cycles. Meaning, assuming that a reading voltage is 2.0V, a threshold voltage may exceed 2.0V under the condition of approximately 5,000 to 10,000 cycles. This may cause an operational failure because of a difficulty in making a distinction between a program state and an erase state.

SUMMARY

Embodiments are related to a non-volatile memory device and a driving method thereof that enhances endurance or cycle characteristics of a single poly EEPROM cell by separating a reading operation part from program/erase operation parts.

In accordance with embodiments, a non-volatile memory device can include at least one of the following: a floating gate formed on and/or over a first type well, and transistors formed on and/or over a second type well and connected in series to the floating gate, one of the transistors being a first transistor for program and erase operations and the other transistor being a second transistor for a reading operation.

In accordance with embodiments, a non-volatile memory device can include at least one of the following: a floating gate formed on and/or over a first type well, a first transistor formed on and/or over a second type well and connected in series to the floating gate for implementation of program and erase operations, and a second transistor formed on and/or over the second type well and connected in series to the floating gate for implementation of a reading operation, a source of the first transistor and a drain of the second transistor being shared as a single doped region by the first and second transistors.

In accordance with embodiments, a non-volatile memory device driving method can include at least one of the following: performing a program operation in which electrons are injected into a floating gate of a first transistor as a first voltage is applied to a source and a drain at opposite sides of the floating gate, a second voltage is applied to a drain of the first transistor, and a ground voltage is applied to the source of the first transistor and a source and the drain of the second transistor, performing an erase operation in which the electrons injected into the floating gate of the first transistor are moved into the drain of the first transistor as the ground voltage is applied to the source and drain of the floating gate and the source of the second transistor, a third voltage is applied to the drain of the first transistor, and the source of the first transistor and the drain of the second transistor are floated, and performing a reading operation for reading an erase state under the flow of current from the drain of the second transistor to the source of the second transistor as a fourth voltage is applied to the source and drain of the floating gate, a fifth voltage is applied to the source of the first transistor and the drain of the second transistor, the ground voltage is applied to the source of the second transistor, and the drain of the first transistor is floated.

DRAWINGS

FIG. 1A to 1D illustrates single poly EEPROM.

Example FIGS. 2 to 7 illustrate a single poly EEPROM, in accordance with embodiments.

DESCRIPTION

Reference will now be made in detail to embodiments, examples of which are illustrated in the accompanying drawings. Wherever possible, the same reference numbers will be used throughout the drawings to refer to the same or like parts.

Hereinafter, configurations and operations in accordance with embodiments will be described with respect to the accompanying drawings. The configurations and operations of embodiments, which are illustrated in the drawings and are described with reference to the drawings, are given by way of at least one embodiment, and technical ideas and core configurations and operations of embodiments are not limited to the following description.

Figure 2:
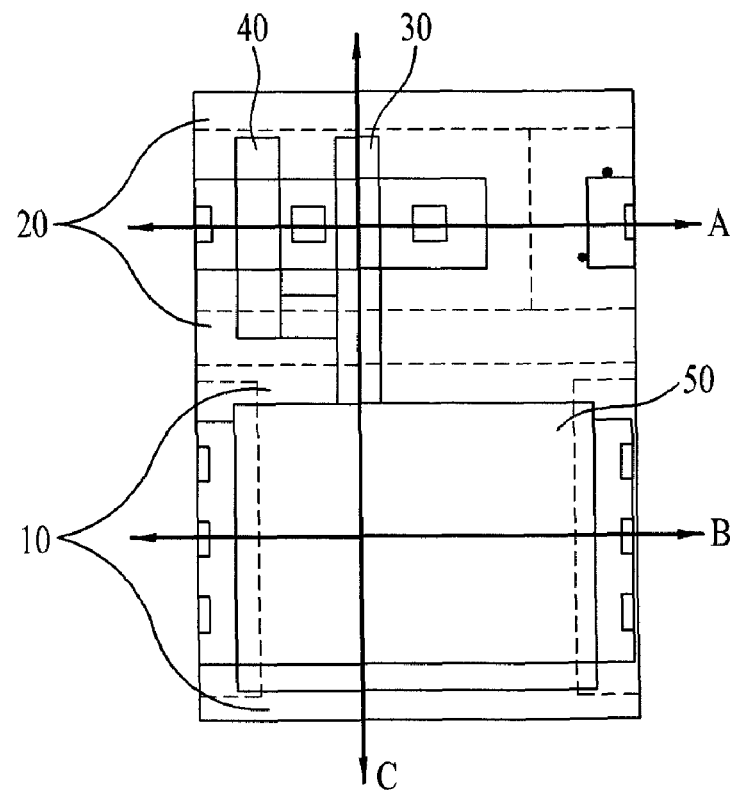
Figure 3A:
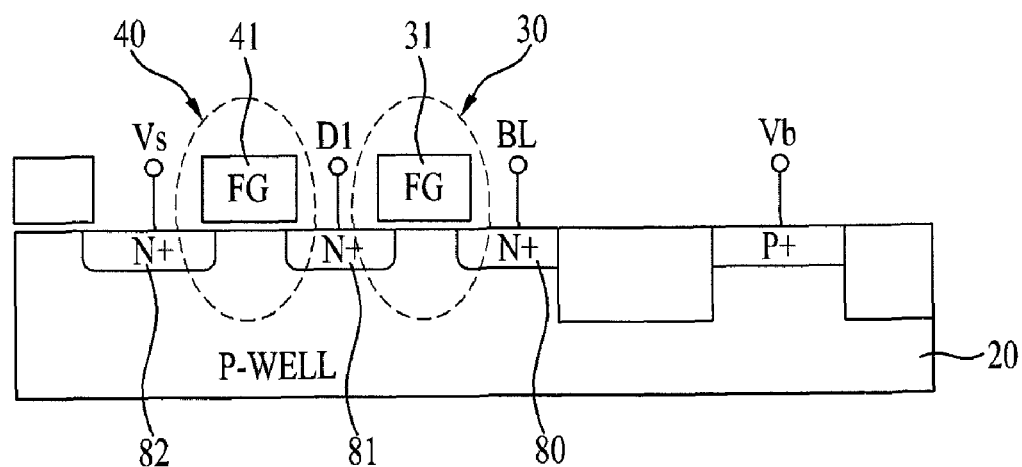

Example FIG. 2 is a plan view illustrating a unit cell of a single poly EEPROM in accordance with embodiments. Example FIGS. 3A to 3C are longitudinal sectional views illustrating vertical profiles viewed, respectively, from directions designated by the arrows A, B and C of example FIG. 2.

As illustrated in example FIG. 2 and FIGS. 3A to 3C, floating gate 50 is formed on and/or over an N-well 10, and first doped region 60 and second doped region 70 are formed in N-well 10 at opposite sides of floating gate 50. Both first doped region 60 and second doped region 70 are connected to a terminal such as word line WL. Accordingly, the same voltage is applied to both first doped region 60 and second doped region 70.

Figure 3B:
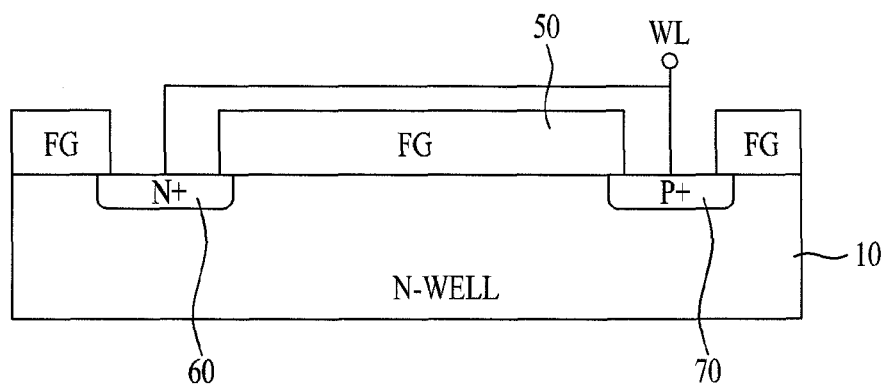
Figure 3C:
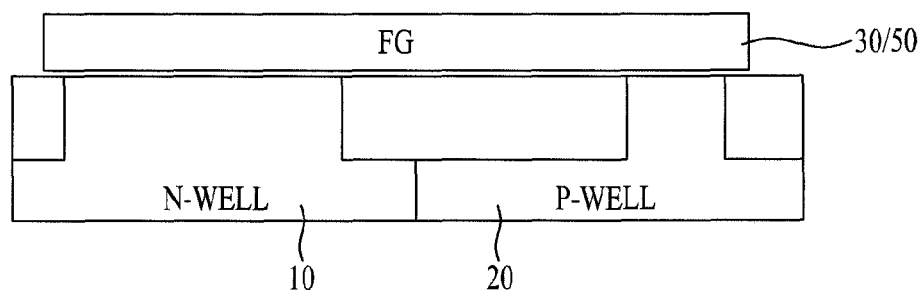

As illustrated in example FIG. 3B, first N-type doped region 60 and second P-type doped region 70 are formed in N-well 10 at opposite sides of floating gate 50.

In accordance with embodiments, first doped region 60 and second doped region 70 may be formed in N-well 10 at opposite sides of the floating gate 50 and may also be connected separately to different terminals. In such embodiments, only N-type doped regions or only P-type doped regions may be formed in N-well 10 at opposite sides of floating gate 50.

In accordance with embodiments, an N-type doped region or a P-type doped region may be formed only at one side of floating gate 50 rather than being formed at opposite sides of floating gate 50.

In accordance with embodiments, N-type doped regions or P-type doped regions may be formed in N-well 10 at three or four sides of floating gate 50. In addition, both N-type doped regions and P-type doped regions may be formed in N-well 10 at three or four sides of floating gate 50. First NMOS device 30 and second NMOS device 40, i.e., two NMOS transistors, are formed on and/or over P-well 20. First NMOS device 30 and second NMOS device 40 are connected in series to floating gate 50. One of first NMOS device 30 and second NMOS device 40 can be a PGM/ERS NMOS device for program and erase operations while the other NMOS device can be a reading NMOS device for a reading operation.

As illustrated in example FIG. 3A, a vertical profile viewed from the direction A of example FIG. 2, first floating gate 31 and second floating 41 of first NMOS device 30 and second NMOS device 40 are formed on and/or over P-well 20. One of first floating gate 31 and second floating 41 can be the floating gate of the PGM/ERS NMOS device and the other floating gate can be the floating gate of the reading NMOS device Third N-type doped region 80 and fourth N-type doped region 81 are formed in P-well 20 at opposite sides of floating gate 31 of PGM/ERS NMOS device 30. In addition to fourth N-type doped region 81 formed in P-well 20 at one side of floating gate 41 of the reading NMOS device 40, fifth N-type doped region 82 is formed in P-well 20 at the other side of floating gate 41 of reading NMOS device 40. Fourth N-type doped region 81, which is formed in P-well 20 between floating gate 31 of PGM/ERS NMOS device 30 and floating gate 41 of reading NMOS device 40, is shared by PGM/ERS NMOS device 30 and reading NMOS device 40.

As illustrated in example FIG. 3B, which is a vertical profile viewed from the direction B of example FIG. 2, floating gate 50 is formed on and/or over N-well 10, and first doped region 60 and second doped region 70 are formed in N-well 10 at opposite sides of floating gate 50. Here, various formation embodiments related to first doped region 60 and second doped region 70 are described above, and thus, a detailed description thereof will be omitted.

As illustrated in example FIG. 3C, which is a vertical profile viewed from the direction C of example FIG. 2, first floating gate 30 and second floating gate 50 are formed across N-well 10 and P-well 20. Next, program/erase/reading operations with respect to a cell of the single poly EEPROM will be described respectively with reference to the configuration illustrated in example FIGS. 2 and 3A to 3C.

Figure 4A:
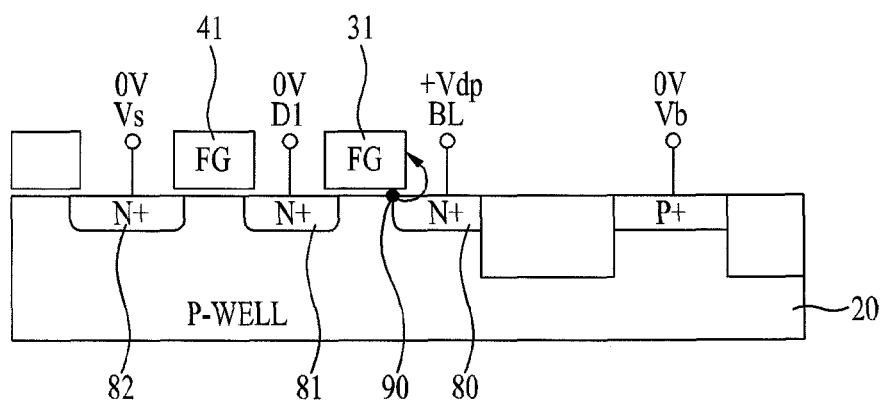
Figure 4B:
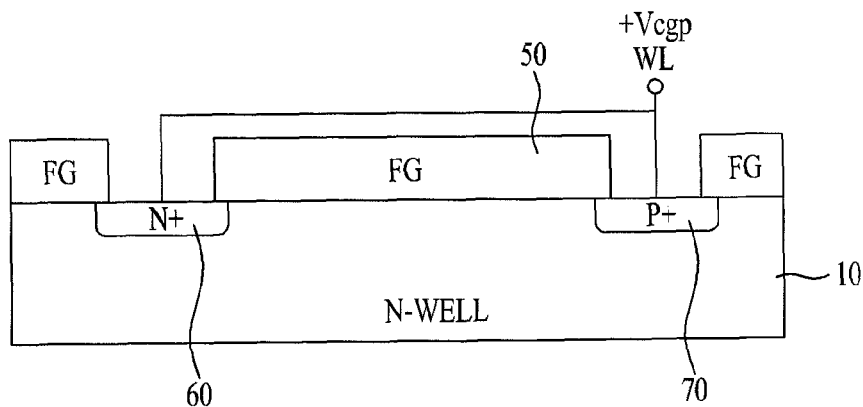
Figure 4C:
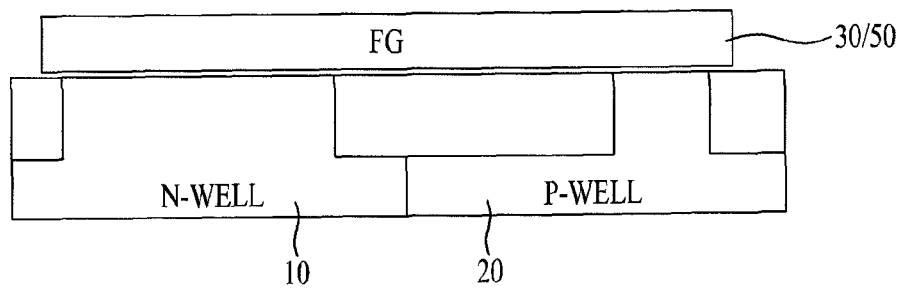

Example FIGS. 4A to 4C are longitudinal sectional views explaining a program operation with respect to the cell of the single poly EEPROM in accordance with embodiments. More particularly, example FIG. 4A illustrates the vertical profile viewed from the direction A of example FIG. 2, example FIG. 4B illustrates the vertical profile viewed from the direction B of FIG. 2, and example FIG. 4C illustrates the vertical profile viewed from the direction C of example FIG. 2.

As illustrated in example FIGS. 4A to 4C, a predetermined voltage +Vcgp is applied to word line WL, a predetermined voltage +Vdp is applied to bit line BL, and a ground voltage (zero volts) is applied to other terminals Vs, D1 and Vb. Here, word line WL is connected to first doped region 60 and second doped region 70 formed in N-well 10 at opposite sides of floating gate 50. Bit line BL is connected to third doped region 80 formed in P-well 20 at one side of floating gate 31 of the PGM/ERS NMOS device 30. Here, third doped region 80 is preferably a drain region. Of the other terminals Vs, D1 and Vb, the terminal Vs is connected to fifth doped region 82 formed in P-well 20 at one side of floating gate 41 of reading NMOS device 40, and terminal D1 is connected to fourth N-type doped region 81 formed in P-well 20 between floating gate 31 of PGM/ERS NMOS device 30 and floating gate 41 of reading NMOS device 40.

Under a bias condition in which predetermined voltages are applied to word line WL, bit line BL, and other terminals Vs, D1 and Vb, as the voltage +Vcgp is applied to second doped region 70 via word line WL, a predetermined potential is induced in floating gate 50 by a coupling ratio. In turn, the potential induced in floating gate 50 inverts channel regions of reading NMOS device 40 and PGM/ERS NMOS device 30, allowing first NMOS device 30 and second NMOS device 40 to be turned on.

Under the turned-on condition of first NMOS device 30 and second NMOS device 40, no flow of current occurs between fourth doped region 81 and fifth doped region 82 because the ground voltage (zero volts) is applied to both fourth doped region 81 and fifth doped region 82 corresponding to source/drain regions at opposite sides of reading NMOS device 40.

On the other hand, in the case of PGM/ERS NMOS device 30, since the predetermined voltage +Vdp is applied via bit line BL to third doped region 80 corresponding to the drain region, and the ground voltage (zero volts) is applied via terminal D1 to fourth doped region 81 corresponding to a source region, current flow occurs from third doped region 80 corresponding to the drain region to fourth doped region 81 corresponding to the source region. In this case, hot electrons 90 are generated near a drain junction and are injected into floating gate 31 of PGM/ERS NMOS device 30. Thereby, threshold voltages of PGM/ERS NMOS device 30 and reading NMOS device 40 are increased simultaneously.

Figure 5A:
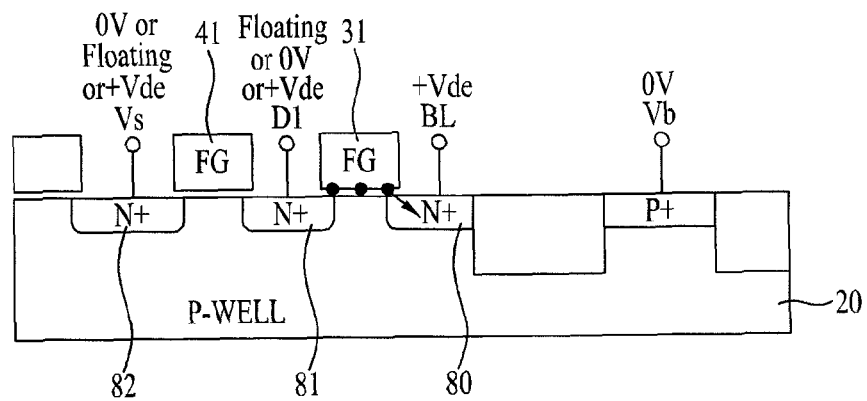
Figure 5B:
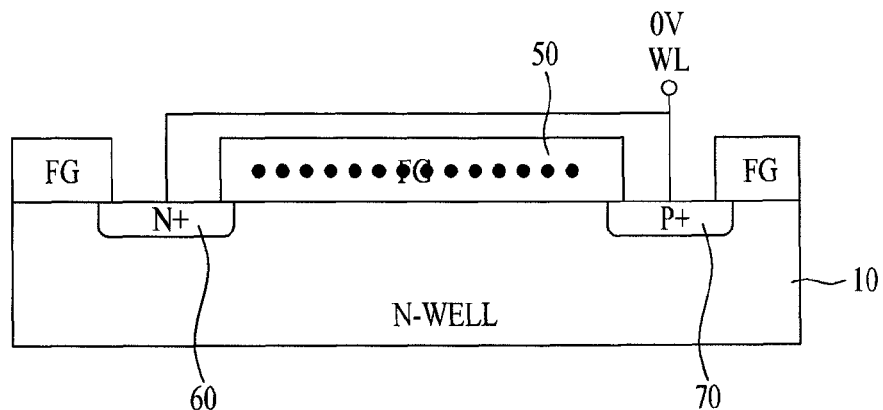
Figure 5C:
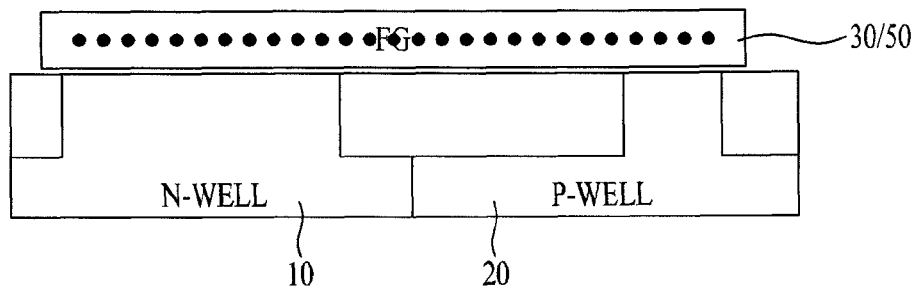

Example FIGS. 5A to 5C are longitudinal sectional views explaining an erase operation with respect to the cell of the single poly EEPROM, in accordance with embodiments. More particularly, FIG. 5A illustrates the vertical profile viewed from the direction A of example FIG. 2, example FIG. 5B illustrates the vertical profile viewed from the direction B of example FIG. 2, and example FIG. 5C illustrates the vertical profile viewed from the direction C of example FIG. 2.

As illustrated in example FIGS. 5A to 5C, the ground voltage (zero volts) is applied to word line WL, and a predetermined voltage +Vde is applied to bit line BL. Here, as described above, word line WL is connected to first doped region 60 and second doped region 70 formed in N-well 10 at opposite sides of floating gate 50, and bit line BL is connected to third doped region 80 corresponding to the drain region of PGM/ERS NMOS device 30.

Of the other terminals Vs, D1 and Vb, the ground voltage (zero volts) is applied to the terminal Vb. Terminal D1, which is connected to fourth doped region 81 formed between floating gate 31 of PGM/ERS NMOS device 30 and floating gate 41 of reading NMOS device 40, is floated. Alternatively, the ground voltage (zero volts) may be applied to terminal D1, or the predetermined voltage +Vde may be applied to terminal D1 in the same manner as bit line BL. In addition, the ground voltage (zero volts) is applied to terminal Vs connected to fifth doped region 82 corresponding to the source region of reading NMOS device 40. Alternatively, terminal Vs may be floated, or the predetermined voltage +Vde may be applied to terminal Vs in the same manner as bit line BL.

Under a bias condition in which zero volts are applied to word line WL and terminals Vb and Vs, the predetermined voltage +Vde is applied to bit line BL and terminal D1 is floated, as zero volts are applied to N-well 10, a low potential substantially equal to zero volts is induced in floating gate 50 by a coupling ratio. In addition, the voltage +Vde applied to bit line BL creates a high-strength electric field between third doped region 80 corresponding to the drain region of PGM/ERS NMOS device 30 and floating gate 31 of PGM/ERS NMOS device 30. The electric field causes the electrons injected into floating gate 31 of PGM/ERS NMOS device 30 to be moved to third doped region 80 corresponding to drain region of PGM/ERS NMOS device 30. Thereby, threshold voltages of PGM/ERS NMOS device 30 and reading NMOS device 40 are reduced simultaneously.

Figure 6A:
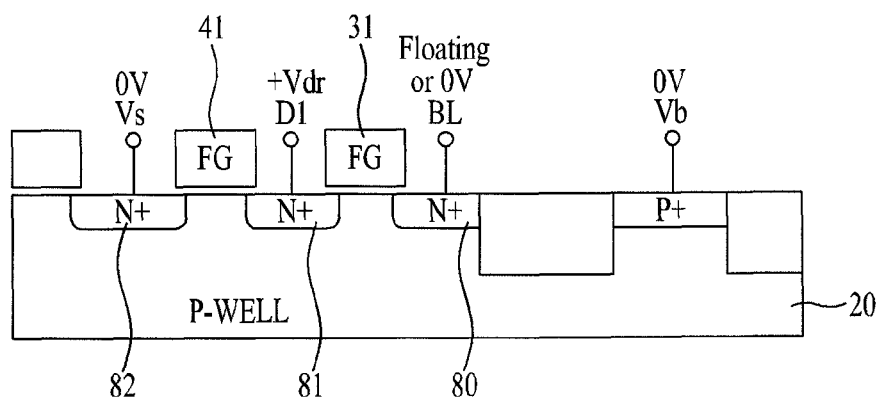
Figure 6B:
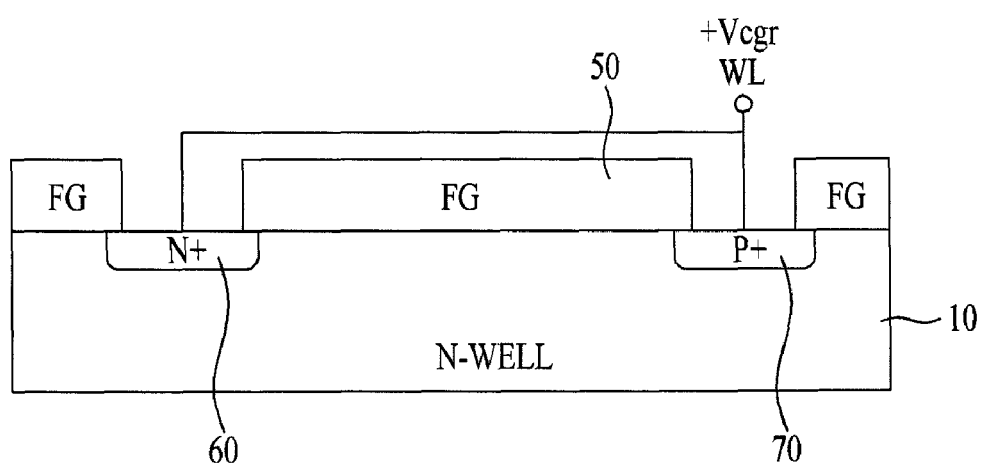
Figure 6C:
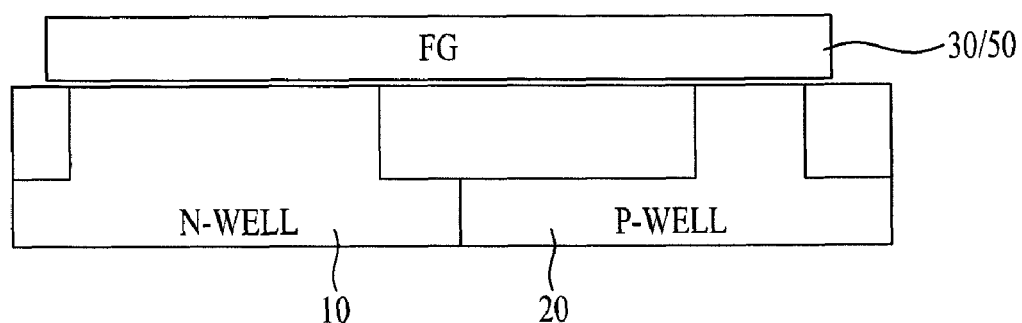

Example FIGS. 6A to 6C are longitudinal sectional views explaining a reading operation with respect to the cell of the single poly EEPROM, in accordance with embodiments. More particularly, example FIG. 6A illustrates the vertical profile viewed from the direction A of example FIG. 2, example FIG. 6B illustrates the vertical profile viewed from the direction B of example FIG. 2, and example FIG. 6C illustrates the vertical profile viewed from the direction C of example FIG. 2.

As illustrated in example FIGS. 6A to 6C, a predetermined voltage +Vcgr is applied to word line WL and bit line BL is floated as illustrated in example FIG. 6B. In this case, the ground voltage (zero volts) may be applied to bit line BL. Here, as described above, word line WL is connected to the first doped region 60 and second doped region 70 formed in N-well 10 at opposite sides of floating gate 50, and bit line BL is connected to third doped region 80 corresponding to the drain region of PGM/ERS NMOS device 30.

Of the other terminals Vs, D1 and Vb, the ground voltage (zero volts) is applied to terminal Vb. A predetermined voltage +Vdr is applied to terminal D1, which is connected to fourth doped region 81 formed between floating gate 31 of PGM/ERS NMOS device 30 and floating gate 41 of reading NMOS device 40. In addition, the ground voltage (zero volts) is applied to terminal Vs which is connected to fifth doped region 82 corresponding to the source region of reading NMOS device 40.

Under a bias condition in which zero volts are applied to terminals Vb and Vs, the predetermined voltage +Vcgr is applied to world line WL, bit line BL is floated and the predetermined voltage +Vdr is applied to terminal D1, as the voltage +Vcgr is applied to N-well 10, a predetermined potential is induced in floating gate 50 by a coupling ratio. Assuming a program state in which electrons are injected into floating gate 31 of PGM/ERS NMOS device 30, PGM/ERS NMOS device 30 and reading NMOS device 40 have considerably high threshold voltages and are turned off, causing no current flow. On the other hand, assuming an erase state in which no electrons are present in floating gate 31 of PGM/ERS NMOS device 30, PGM/ERS NMOS device 30 and reading NMOS device 40 have considerably low threshold voltages and are turned on by the potential induced in floating gate 50.

In a state such that PGM/ERS NMOS device 30 and reading NMOS device 40 are turned on as described above, third doped region 80 corresponding to the drain region of PGM/ERS NMOS device 30 is in a floating state and there occurs no current flow. In the case of reading NMOS device 40, since the voltage +Vdr is applied to fourth doped region 81 corresponding to the drain region of reading NMOS device 40 and the ground voltage (zero volts) is applied to fifth doped region 82 corresponding to the source region of reading NMOS device 40, current flows from fourth doped region 81 corresponding to the drain region to fifth doped region 82 corresponding to the source region, reading of an erase state is possible.

In the above-described reading NMOS device 40, bias conditions of fourth doped region 81 corresponding to the drain region and fifth doped region 82 corresponding to the source region may be changed with each other. Specifically, the voltage +Vdr may be applied to terminal Vs and the ground voltage (zero volts) may be applied to terminal D1.

Example FIG. 7 is a table illustrating bias conditions for the program/ease/reading operations with respect to the cell of the single poly EEPROM, in accordance with embodiments.

In accordance with embodiments, program and erase operations are performed via PGM/ERS NMOS device 30, whereas a reading operation is performed via reading NMOS device 40. Accordingly, electron traps caused by program and erase operations are mainly found only in third doped region 80 corresponding to the drain region of PGM/ERS NMOS device 30, and are not found in the fourth doped region 81 and fifth doped region 82 corresponding to the drain/source regions of reading NMOS device 40. As a result, even if the number of program/erase operations is increased, i.e. the number of cycles is increased, there occurs no problematic increase in program/erase threshold voltages, more particularly, in an erase threshold voltage. This has the effect of remarkably improving endurance characteristics of a memory device.

As is apparent from the above description, in accordance with embodiments, as a result of performing program/erase operations via a PGM/ERS NMOS device and performing a reading operation via a reading NMOS device, electron traps caused by program and erase operations are mainly found only in a drain region of the PGM/ERS NMOS device and are not found in drain/source regions of the reading NMOS device. As a result, even if the number of program/erase operations is increased, i.e., the number of cycles is increased to repeatedly perform the program/erase operations, there occurs no problem of an increase in program/erase threshold voltages, more particularly, in an erase threshold voltage. This provides an advantage of remarkably improving endurance characteristics of a memory device.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An apparatus comprising:
a first well having a first conductivity type;
a second well having a second conductivity type;
a floating gate formed over the first well; and
a plurality of transistors formed over the second well and connected in series to the floating gate, wherein one of the transistors is a first transistor for program and erase operations and another one of the transistors is a second transistor for a reading operation.

2. The apparatus of claim 1, wherein the first conductivity type comprises an N-type, and the second type is a P-type.

3. The apparatus of claim 1, wherein the second conductivity type comprises a P-type.

4. The apparatus of claim 1, further comprising first and second doped regions formed in the first well at opposite sides of the floating gate.

5. The apparatus of claim 4, wherein the first and second doped regions are connected to a word line.

6. The apparatus of claim 5, wherein the first transistor comprises an N-channel Metal Oxide Semiconductor (NMOS) transistor.

7. The apparatus of claim 6, wherein the first transistor comprises a first floating gate formed over the second well, and a third doped region formed in the second well at one side of the first floating gate.

8. The apparatus of claim 7, wherein the second transistor comprises an N-channel Metal Oxide Semiconductor (NMOS) transistor.

9. The apparatus of claim 8, wherein the second transistor comprises a second floating gate formed over the second well, and a fourth doped region formed in the second well at one side of the second floating gate.

10. The apparatus of claim 9, further comprising a fifth doped region formed in the second well between the first floating gate and the second floating gate.

11. The apparatus of claim 10, wherein the fifth doped region is shared by the first and second transistors.

12. The apparatus of claim 11, wherein the third doped region corresponds to a drain region of the first transistor and is connected to a bit line.

13. The apparatus of claim 12, wherein the fifth doped region is connected to a first terminal for application of a predetermined voltage, and the fourth doped region is connected to a second terminal for application of a predetermined voltage.

14. The apparatus of claim 1, wherein the apparatus comprises a non-volatile memory device.

15. A method comprising:
providing a non-volatile memory device including a floating gate formed over a first well having a first conductivity type, a first transistor for program and erase operations formed over a second well having a second conductivity type connected in series to the floating gate, and a second transistor formed over the second well for a reading operation connected in series to the floating gate;
performing a program operation in which electrons are injected into a floating gate of the first transistor as a first voltage is applied to a source and a drain at opposite sides of the floating gate, a second voltage is applied to a drain of the first transistor, and a ground voltage is applied to the source of the first transistor and a source and the drain of the second transistor;
performing an erase operation in which the electrons injected into the floating gate of the first transistor are moved into the drain of the first transistor as the ground voltage is applied to the source and drain of the floating gate and the source of the second transistor, a third voltage is applied to the drain of the first transistor, and the source of the first transistor and the drain of the second transistor are floated; and then
performing a reading operation for reading an erase state under the flow of current from the drain of the second transistor to the source of the second transistor as a fourth voltage is applied to the source and drain of the floating gate, a fifth voltage is applied to the source of the first transistor and the drain of the second transistor, the ground voltage is applied to the source of the second transistor, and the drain of the first transistor is floated.

16. The method of claim 15, wherein the first and second transistors are turned on by a predetermined potential that is induced in the floating gate formed on the first well as the first voltage is applied to the source and the drain at opposite sides of the floating gate.

17. The method of claim 15, wherein the first transistor comprises an N-channel Metal Oxide Semiconductor (NMOS) transistor.

18. The method of claim 17, wherein the second transistor comprises an N-channel Metal Oxide Semiconductor (NMOS) transistor.

19. The method of claim 15, wherein the first conductivity type comprises an N-type, and the second type is a P-type.

20. The method of claim 19, wherein the second conductivity type comprises a P-type.

* * * * *